(12) United States Patent
Hatori et al.

(10) Patent No.: US 8,232,125 B2
(45) Date of Patent: Jul. 31, 2012

(54) OPTICAL SEMICONDUCTOR DEVICE HAVING ACTIVE LAYER OF P-TYPE QUANTUM DOT STRUCTURE AND ITS MANUFACTURE METHOD

(75) Inventors: Nobuaki Hatori, Kanagawa (JP); Tsuyoshi Yamamoto, Kawasaki (JP); Hisao Sudo, Kawasaki (JP); Yasuhiko Arakawa, Kanagawa (JP)

(73) Assignees: Fujitsu Limited, Kawasaki (JP); The University of Tokyo, Tokyo (JP)

( * ) Notice: Subject to any disclaimer, the term of this patent is extended or adjusted under 35 U.S.C. 154(b) by 554 days.

(21) Appl. No.: 12/457,677

(22) Filed: Jun. 18, 2009

(65) Prior Publication Data
US 2009/0263926 A1 Oct. 22, 2009

Related U.S. Application Data

(62) Division of application No. 11/976,120, filed on Oct. 22, 2007, now Pat. No. 7,573,060.

(30) Foreign Application Priority Data

Dec. 27, 2006 (JP) ................................. 2006-352011

(51) Int. Cl.
*H01L 21/00* (2006.01)
(52) U.S. Cl. ........ 438/39; 438/29; 257/21; 257/E25.019
(58) Field of Classification Search ............... 438/29, 438/31, 39, 45; 257/13, 21, E21.021, E25.019
See application file for complete search history.

(56) References Cited

U.S. PATENT DOCUMENTS
5,637,511 A 6/1997 Kurihara ..................... 438/79
(Continued)

FOREIGN PATENT DOCUMENTS
EP 1717919 A2 11/2006
(Continued)

OTHER PUBLICATIONS
Office Action dated Aug. 23, 2011 "Notice of Reasons of Rejection" with English Translation corresponding to Japanese Patent Application No. 2006-352011.
(Continued)

*Primary Examiner* — David Vu
(74) *Attorney, Agent, or Firm* — Kratz, Quintos & Hanson, LLP

(57) ABSTRACT

An active layer having a p-type quantum dot structure is disposed over a lower cladding layer made of semiconductor material of a first conductivity type. An upper cladding layer is disposed over the active layer. The upper cladding layer is made of semiconductor material, and includes a ridge portion and a cover portion. The ridge portion extends in one direction, and the cover portion covers the surface on both sides of the ridge portion. A capacitance reducing region is disposed on both sides of the ridge portion and reaching at least the lower surface of the cover portion. The capacitance reducing region has the first conductivity type or a higher resistivity than that of the ridge portion, and the ridge portion has a second conductivity type. If the lower cladding layer is an n-type, the capacitance reducing region reaches at least the upper surface of the lower cladding layer.

7 Claims, 10 Drawing Sheets

U.S. PATENT DOCUMENTS

| | | | |
|---|---|---|---|
| 6,165,811 A * | 12/2000 | Lee et al. | 438/45 |
| 6,618,411 B1 | 9/2003 | Takiguchi et al. | |
| 6,865,204 B2 | 3/2005 | Matsuyama et al. | |
| 7,522,647 B2 | 4/2009 | Hatori et al. | |

FOREIGN PATENT DOCUMENTS

| | | |
|---|---|---|
| JP | 2001-230494 A | 8/2001 |
| JP | 2002-232079 A | 8/2002 |
| JP | 2006-286902 A | 10/2006 |

OTHER PUBLICATIONS

N. Hatori, et al.; "20° C.-70° C. Temperature Independent 10 Gb/s Operation of a Directly Modulated Laser Diode Using P-doped Quantum Dots;" *Technical Digest of 30th European Conference on Optical Communication, post-deadline paper Th4.3.4*; Sep. 5-9, 2004; 1 Sheet.

* cited by examiner

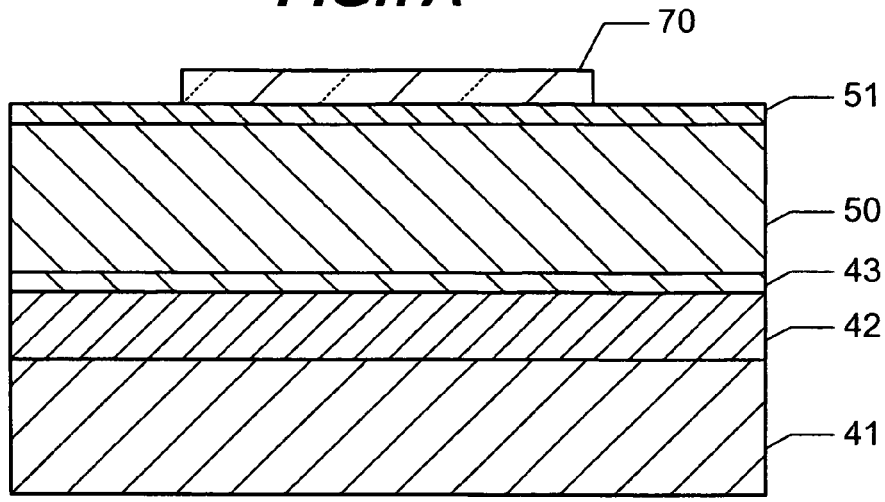
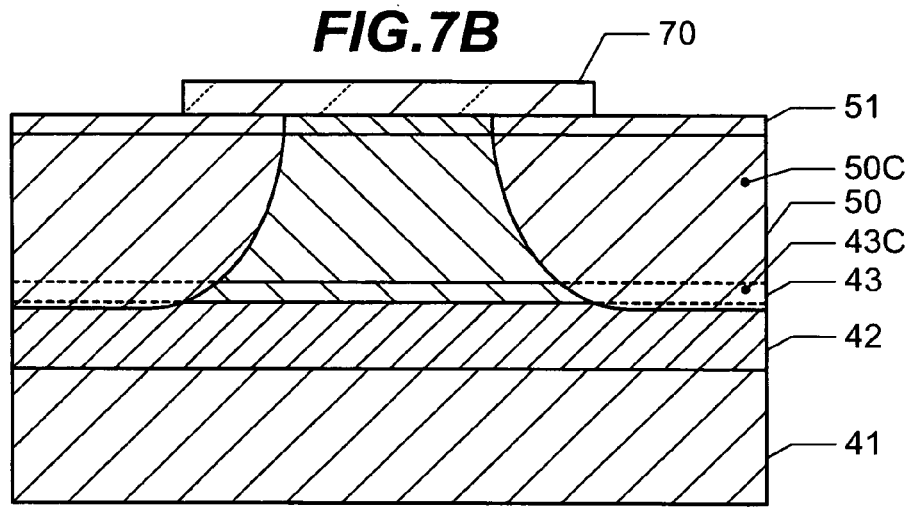
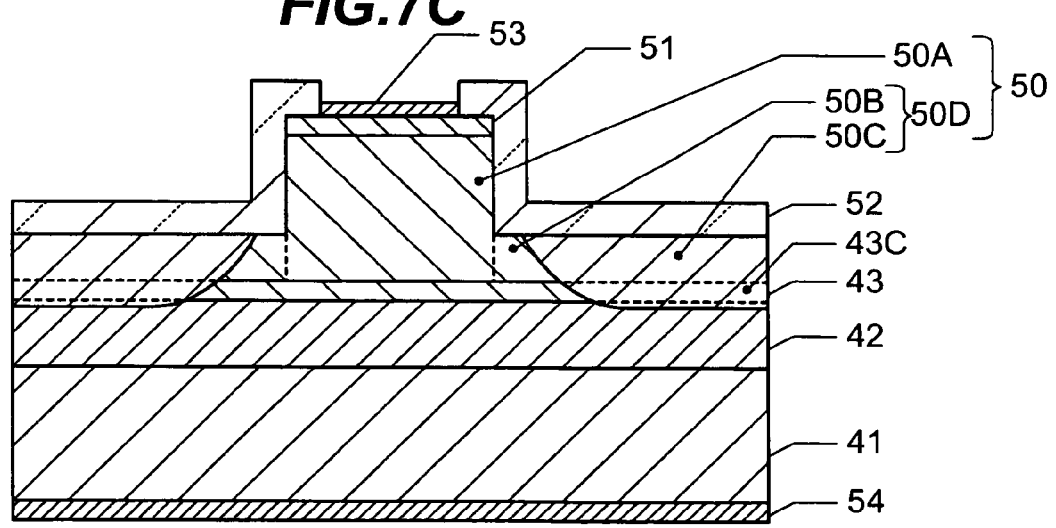

OPTICAL SEMICONDUCTOR DEVICE HAVING ACTIVE LAYER OF P-TYPE QUANTUM DOT STRUCTURE AND ITS MANUFACTURE METHOD

CROSS-REFERENCE TO RELATED APPLICATIONS

This application is based on and claims priority of Japanese Patent Application No. 2006-352011 filed on Dec. 27, 2006; and is a Divisional of prior application Ser. No. 11/976,120 filed on Oct. 22, 2007 now U.S. Pat. No. 7,573,060, the entire contents of which are incorporated herein by reference

BACKGROUND OF THE INVENTION

A) Field of the Invention

The present invention relates to an optical semiconductor device and its manufacture method, and more particularly to an optical semiconductor device having an active layer of a p-type quantum dot structure and its manufacture method.

B) Description of the Related Art

By applying a p-type quantum dot structure to an active layer of a semiconductor laser device, temperature characteristics can be improved considerably. From this reason, a semiconductor laser device having an active layer of the p-type quantum dot structure (hereinafter called a "p-type quantum dot laser device") is expected as a direct modulation light emitting device for a transmitter to be used as a light source mainly in a short distance optical fiber communication field. The device has preferably a small electrostatic capacitance in order to operate as a direct modulation light emitting device.

FIG. 8A is a schematic cross sectional view of a conventional p-type quantum dot laser device having a small electrostatic capacitance. On a p-type substrate 100, a p-type lower cladding layer 101 is formed, and on the lower cladding layer, a p-type quantum dot active layer 102 is formed. On the active layer 102, a ridge shaped upper cladding layer 103 is formed. On both sides of the upper cladding layer 103, the active layer 102 is exposed. A pn junction interface does not expand on the whole surface of the substrate but is restricted to the region where the upper cladding layer 103 is disposed, so that an electrostatic capacitance can be made small.

FIG. 8B is a schematic cross sectional view of a p-type quantum dot laser device described in a document, "20° C. to 70° C. Temperature Independent 10 Gb/s Operation of a Directly Modulated Laser Diode Using P-doped Quantum Dots", by Nobuaki Hatori et al., Technical Digest of 30th European Conference on Optical Communication, post-deadline paper Th4.3.4. On an n-type substrate 110, an n-type lower cladding layer 111, a p-type quantum dot active layer 112 and a ridge type p-type upper cladding layer 113 are formed in this order. In a region where the upper cladding layer 113 is not disposed, etching is performed to at least the bottom of the active layer 112. If the active layer is left on the whole surface of the substrate as shown in FIG. 8A, a pn junction interface between the active layer 112 and lower cladding layer 111 extends to the whole surface of the substrate so that an electrostatic capacitance increases. By etching both sides of the upper cladding layer 113 to the bottom of the active layer 112, the pn junction interface can be restricted to the region where the upper cladding layer 113 is disposed.

In order to operate the p-type quantum dot laser devices shown in FIGS. 8A and 8B in a single transverse mode, a width of the ridge shaped upper cladding layer is required to be narrow. However, if the upper cladding layer is made narrow, the device resistance rises.

SUMMARY OF THE INVENTION

According to one aspect of the present invention, there is provided an optical semiconductor device including:

a lower cladding layer made of semiconductor material of a first conductivity type;

an active layer disposed over the lower cladding layer and having a p-type quantum dot structure;

an upper cladding layer disposed over the active layer, made of semiconductor material, and comprising a ridge portion and a cover portion, the ridge portion extending in one direction on a surface of the active layer, and the cover portion covering the surface of the active layer on both sides of the ridge portion; and a capacitance reducing region disposed on both sides of the ridge portion and reaching at least a lower surface of the cover portion from an upper surface of the cover portion, wherein:

the capacitance reducing region has the first conductivity type or a higher resistivity than a resistivity of the ridge portion, and the ridge portion has a second conductivity type opposite to the first conductivity type; and if the lower cladding layer is an n-type, the capacitance reducing region reaches at least an upper surface of the lower cladding layer.

According to another aspect of the present invention, there is provided a method for manufacturing an optical semiconductor device including steps of:

(a) forming an active layer having a p-type quantum dot structure over a lower cladding layer made of semiconductor material of a first conductivity type;

(b) forming an upper cladding layer made of semiconductor material of a second conductivity type opposite to the first conductivity type over the active layer;

(c) covering an upper surface of the upper cladding layer in an area extending in one direction, with a mask pattern;

(d) by using the mask pattern as an etching mask, etching the upper cladding layer partway in a thickness direction thereof;

(e) by using the mask pattern as a mask, implanting or diffusing impurities into the upper cladding layer to make the upper cladding layer have the first conductivity type or high resistance to form a capacitance reducing region; and (f) removing the mask pattern, wherein the capacitance reducing region formed in the step (e) reaches at least an upper surface of the active layer if the lower cladding layer is a p-type, and reaches at least an upper surface of the lower cladding layer if the lower cladding layer is an n-type.

According to still another aspect of the present invention, there is provided a method for manufacturing an optical semiconductor device including steps of:

(a) forming an active layer having a p-type quantum dot structure over a lower cladding layer made of semiconductor material of a first conductivity type;

(b) forming an upper cladding layer made of semiconductor material of a second conductivity type opposite to the first conductivity type over the active layer;

(c) covering an upper surface of the upper cladding layer in an area extending in one direction, with a first mask pattern;

(d) by using the first mask pattern as a mask, implanting or diffusing impurities into the upper cladding layer to make the upper cladding layer have the first conductivity type or high resistance to form a capacitance reducing region;

(e) removing the first mask pattern;

(f) covering an inner area spaced by a distance from each of both side edges of the area covered with the first mask pattern, with a second mask pattern; and (g) by using the second mask pattern as an etching mask, etching the upper cladding layer partway in a thickness direction thereof, wherein:

the capacitance reducing region formed in the step (d) reaches at least an upper surface of the active layer if the lower cladding layer is a p-type, and reaches at least an upper surface of the lower cladding layer if the lower cladding layer is an n-type; and a plan shape of the second mask pattern is set in such a manner that after etching in the step (g), the capacitance reducing region is spaced apart in an in-plane direction by a distance from the second mask pattern.

BRIEF DESCRIPTION OF THE DRAWINGS

FIGS. 7A to 7C are cross sectional views of the p-type quantum dot laser device of the second embodiment during manufacture by another manufacture method.

DESCRIPTION OF THE PREFERRED EMBODIMENTS

Figure 1A:
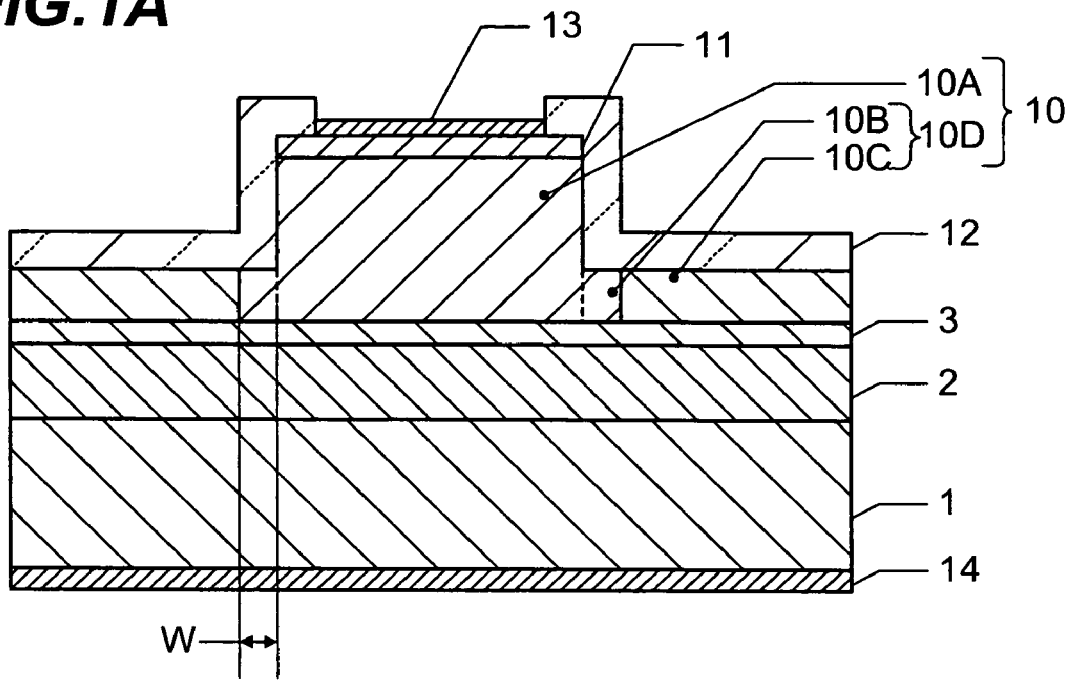
FIG. 1A is a cross sectional view of a p-type quantum dot laser device according to a first embodiment.

FIG. 1A is a cross sectional view of a p-type quantum dot laser device according to the first embodiment. On a semiconductor substrate 1 made of p-type GaAs, a lower cladding layer 2 is formed which is made of p-type $Al_{0.4}Ga_{0.6}As$ and has a thickness of 1.4 µm. On the lower cladding layer 2, a p-type quantum dot active layer 3 is formed.

Figure 1B:
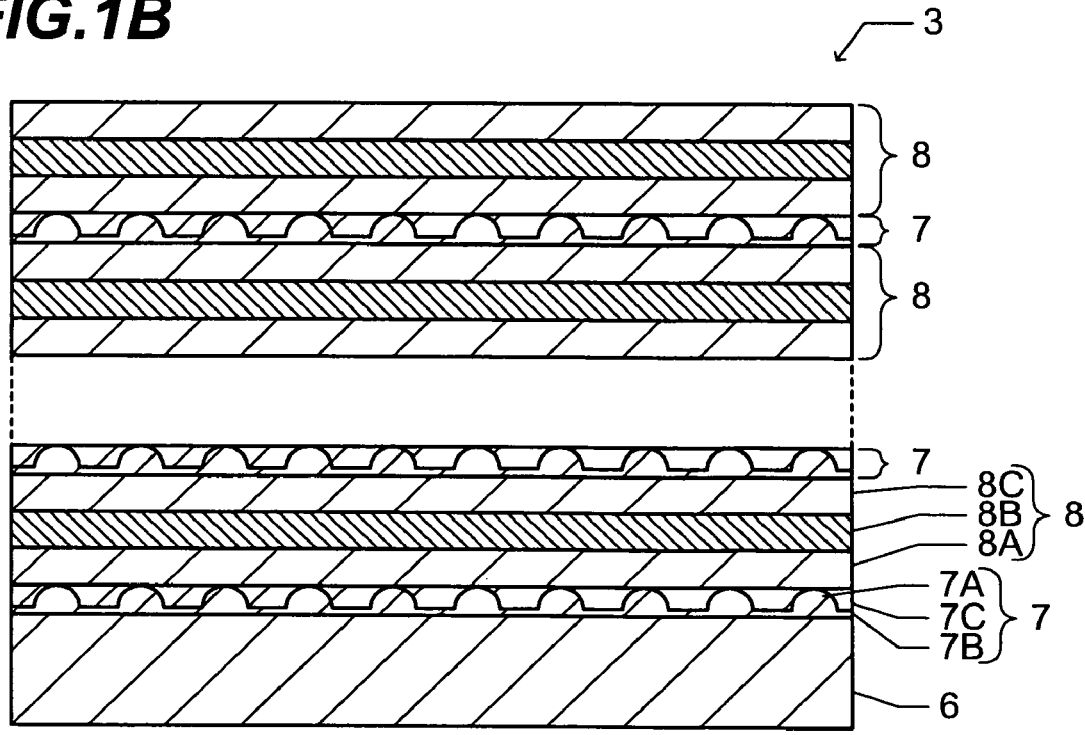
FIG. 1B is a cross sectional view of an active layer of the quantum dot laser device.

FIG. 1B is a cross sectional view of the p-type quantum dot active layer 3. The active layer 3 includes a barrier layer 6 made of non-doped GaAs and having a thickness of 33 nm, and alternately disposed quantum dot layers 7 and barrier layers 8 formed on the barrier layer 6. Ten sets in total of the quantum dot layer 7 and barrier layer 8 are disposed. The number of sets of the quantum dot layer 7 and barrier layer 8 may be set to the number different from ten, depending upon a usage of the semiconductor laser device.

The quantum dot layer 7 is constituted of a number of InAs quantum dots 7A distributed in an in-plane direction, a wetting layer 7B covering thinly the surface of an underlying layer, and an $In_{0.2}Ga_{0.8}As$ strain relaxing layer 7C covering the quantum dots 7A and wetting layer 7B. A density of quantum dots 7A is about $4 \times 10^{10}$ cm$^{-2}$, and a photoluminescence emission wavelength is about 1.3 µm. A thickness of each quantum dot layer 7 is several nm, e.g., about 5 nm.

The barrier layer 8 has a three-layer structure of a non-doped GaAs layer 8A having a thickness of 14 nm, a p-type GaAs layer 8B having a thickness of 10 nm, and a non-doped GaAs layer 8C having a thickness of 9 nm stacked in this order. A p-type impurity concentration of the p-type GaAs layer 8B is $5 \times 10^{17}$ cm$^{-3}$. Each barrier layer 8 may be a single p-type GaAs layer or a two-layer structure of a p-type GaAs layer and a non-doped GaAs layer.

In the first embodiment, although a portion of the barrier layer 8 is a p-type, another portion may be a p-type. For example, the quantum dot itself may be a p-type, or the wetting layer may be a p-type. A "p-type quantum dot active layer" can be defined as a structure that at least one of the quantum dot, wetting layer, strain relaxing layer and barrier layer is doped to a p-type.

Description will continue reverting to FIG. 1A. An upper cladding layer 10 is formed on the active layer 3. The upper cladding layer 10 is constituted of a ridge portion 10A and a cover portion 10D. The ridge portion 10A extends on the surface of the active layer 3 in one direction (a direction perpendicular to the drawing sheet in FIG. 1A). The cover portion 10D covers the surface of the active layer 3 on both sides of the ridge portion 10A. The cover portion 10D is constituted of a ridge contiguous region 10B continuous with the ridge portion 10A and a capacitance reducing region 10C disposed outside the ridge contiguous region 10B. A thickness of the ridge portion 10A is 1 µm. A thickness of the cover portion 10D is 0.1 µm. A width of the ridge portion 10A is 2.3 µm. A width (a size in a direction perpendicular to the extension direction of the ridge portion 10A) W of the ridge contiguous region 10B is, e.g., 1.1 µm.

The ridge portion 10A and ridge contiguous region 10B are made of n-type $Al_{0.4}Ga_{0.6}As$. The capacitance reducing region 10C is made of p-type $Al_{0.4}Ga_{0.6}As$ or $Al_{0.4}Ga_{0.6}As$ having a higher resistance than that of the ridge portion 10A.

A contact layer 11 made of n-type GaAs and having a thickness of 0.2 µm is formed on the ridge portion 10A. A protective film 12 made of SiO2 covers the surfaces of the upper cladding layer 10 and contact layer 11. An opening is formed through the protective film 12, partially exposing the surface of the contact layer 11. An upper electrode 13 is in contact with the contact layer 11 exposed in the opening to serve as an ohmic contact. The upper electrode 13 has a two-layer structure of an AuGe layer and an Au layer. A lower electrode 14 is in contact with the bottom of the semiconductor substrate 1 to serve as an ohmic contact. The lower electrode 14 has a two-layer structure of an AuZn layer and an Au layer.

A length of the p-type quantum dot laser device of the first embodiment (a length in the extension direction of the ridge portion 10A: an optical resonator length) is, e.g., 200 µm. A waveguide is defined under the ridge portion 10A, the waveguide confining light in a thickness direction of the semiconductor substrate 1 (a vertical direction of FIG. 1A) and in a lateral direction in FIG. 1A. A high reflection film having a reflectivity of, e.g., 80% is formed on both end faces of the waveguide.

In the first embodiment, not only the ridge portion 10A but also the cover portion 10D are disposed on the active layer 3. In a device having a conventional structure that the cover portion 10D is not disposed, a cutoff width of a higher harmonic first order transverse mode is about 1.7 µm. Namely, in order to suppress oscillation of the higher harmonic transverse mode, it is necessary to set the width of the ridge portion 10A to 1.7 µm or narrower. In contrast, as a portion (cover portion 10D) of the upper cladding layer 10 extends on both sides of the ridge portion 10A, the conditions for a single transverse mode oscillation are relaxed. For example, a cutoff width of the higher harmonic first order transverse mode in the structure of the first embodiment is about 2.4 µm. In the first embodiment, the width of the ridge portion 10A is 2.3 µm so that oscillation in the higher harmonic transverse mode can be prevented. A device resistance can be reduced by about 30% as compared to the device whose ridge portion 10A has a width of about 1.7 µm.

The capacitance reducing region 10C of the cover portion 10D is the same conductivity type as that of the active layer 3 and lower cladding layer 2, or has a high resistance. Therefore, the pn junction interface between the active layer 3 and upper cladding layer 10 is restricted to the region where the ridge portion 10A and ridge contiguous region 10B are disposed. An electrostatic capacitance can therefore be reduced more than the case in which the whole region of the upper cladding layer 10 has an n-type conductivity. For example, if the optical resonator length is 200 µm, an electrostatic capacitance of the device is as small as about several pF.

Further, in the first embodiment, carriers are injected also into the active layer 3 just under the ridge contiguous region 10B disposed on both sides of the ridge portion 10A. Light generated in the active layer 3 is confined in the region under the ridge portion 10A. A portion of the light penetrates into an outside of the side edges of the ridge portion 10A. In the first embodiment, since carriers are injected also into the active layer 3 into which the light penetrates, it is possible to reduce optical absorption in the region outside the side edges of the ridge portion 10A.

In order to obtain a significant advantage of reducing optical absorption, it is preferable to set a width W of the ridge contiguous region 10B equal to or wider than an oscillation wavelength in waveguide of the active layer 3. In the first embodiment, an oscillation wavelength in the air is about 1.3 µm, and an oscillation wavelength in waveguide is about 0.4 µm. However, if the width W of the ridge contiguous region 10B is too wide, an area of the pn junction interface is broadened and an electrostatic capacitance of the device becomes large. In addition, a spread of current becomes broad so that a threshold current and an operation current increase. In order to suppress an increase in the electrostatic capacitance and a rise of the threshold current and operation current, the width W of the ridge contiguous region 10B is preferably set to 5 µm or narrower.

Next, with reference to FIGS. 2A to 2E, description will be made on a manufacture method for the p-type quantum dot laser device of the first embodiment.

Figure 2A:
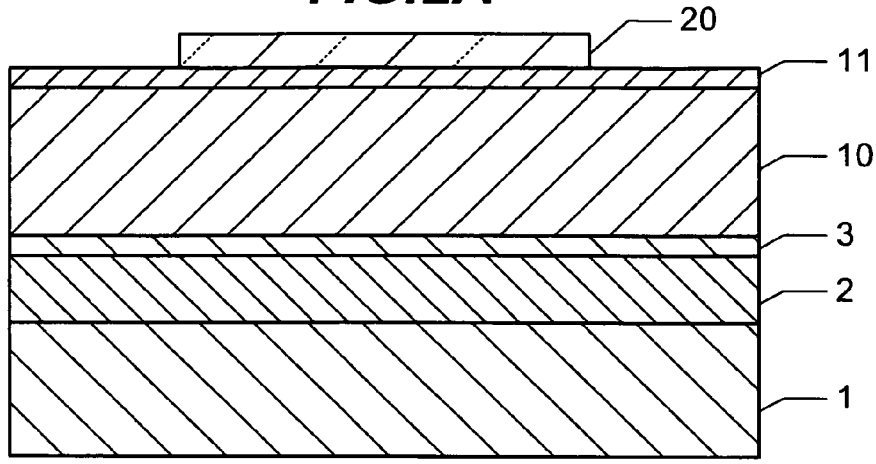
FIGS. 2A to 2E are cross sectional views of the p-type quantum dot laser device of the first embodiment during manufacture.

As shown in FIG. 2A, a semiconductor substrate 1 made of p-type GaAs is prepared. The surface of the semiconductor substrate 1 corresponds to the (001) plane of GaAs single crystal. A lower cladding layer 2 of p-type AlGaAs is formed on the semiconductor substrate 1 by molecular beam epitaxy (MBE). An active layer 3 is formed on the lower cladding layer 2.

A method of forming the active layer 3 will be described below. First, a barrier layer 6 of GaAs is formed by MBE. Quantum dots 7A and a wetting layer 7B are formed on the barrier layer 6, a density of the quantum dots 7A being to about $4\times10^{10}$ cm$^{-2}$, by utilizing a growth mode, e.g., called the Stranski-Krastanow (SK) mode. A specific method forming the quantum dots 7A and wetting layer 7B is disclosed, for example, in Japanese Patent Gazette No. 3672678.

A strain relaxing layer 7C of InGaAs is formed by MBE, covering the quantum dots 7A and wetting layer 7B. A photoluminescence wavelength of the quantum dots 7A is about 1.3 µm. In this way, a quantum dot layer 7 is formed which is constituted of the quantum dots 7A, wetting layer 7B and strain relaxing layer 7C.

In place of the SK mode, the quantum dot layer 7 may be formed by utilizing a droplet epitaxy method, a Volumer-Weber type growth mode or the like, or by utilizing micro processing techniques using patterning and etching.

A non-doped GaAs layer 8A, a p-type GaAs layer 8B and a non-doped GaAs layer 8C are formed in this order on the quantum dot layer 7 by MBE. A barrier layer 8 of a three-layer structure is therefore formed.

By repeating alternately the step of forming the quantum dot layer 7 and the step of forming the barrier layer 8 ten times, the active layer 3 is formed.

Formed on the active layer 3 by MBE are an upper cladding layer 10 made of n-type AlGaAs and having a thickness of 1 µm and a contact layer 11 made of n-type GaAs and having a thickness of 0.2 µm. A SiO$_2$ film having a thickness of 300 nm is formed on the contact layer 11. This SiO$_2$ film is patterned to leave a mask pattern 20. The mask pattern 20 covers the area corresponding to the ridge portion 10A shown in FIG. 1A. A width of the mask pattern 20 is about 4.5 µm which is wider than the width 2.3 µm of the ridge portion 10A.

Figure 2B:
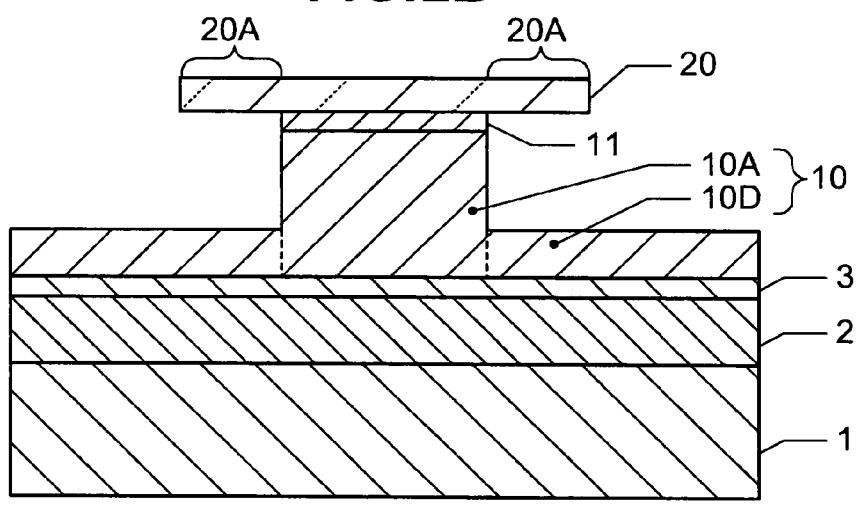

As shown in FIG. 2B, by using the mask pattern 20 as an etching mask, the contact layer 11 and upper cladding layer 10 are isotropically etched until the upper cladding layer 10 is thinned to a thickness of 0.1 µm. Namely, an etching depth is about 1.1 µm. In etching the contact layer 11 and upper cladding layer 10, wet etching may be adopted using phosphoric acid as etchant.

The contact layer 11 and upper cladding layer 10 are etched also laterally from the side edges of the mask pattern 20. Since etching progresses generally isotropically in vertical and horizontal directions, a depth of the laterally etched region from the side edges of the mask pattern 20 is about 1.1 µm. A ridge portion 10A having a width of 2.3 µm is therefore formed. A cover portion 10D having a thickness of 0.1 µm remains on both sides of the ridge portion 10A. The both ends of the mask pattern 20 constitute an eaves portion 20A extending from the side edges of the ridge portion 10A in an eaves shape.

Figure 2C:
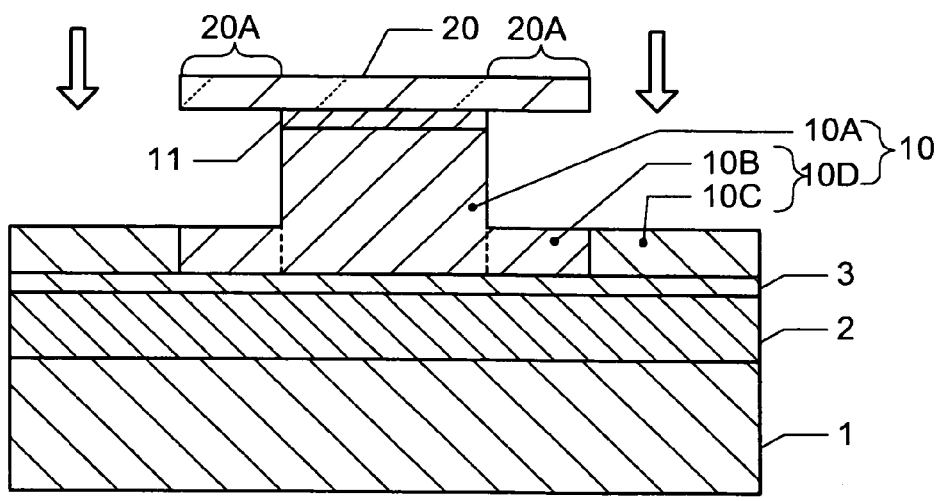

As shown in FIG. 2C, by using the mask pattern 20 as a mask, p-type impurity ions, e.g., Zn ions are implanted into the upper cladding layer 10. Be, Mg or the like may be used instead of Zn. A dose of ion implantation is $1\times10^{13}$ cm$^{-2}$ and an acceleration energy is determined so that a whole region in a thickness direction of the cover portion 10D having a thickness of 0.1 µm becomes a p-type. In this way, a capacitance reducing region 10C having a p-type impurity concentration of $1\times10^{18}$ cm$^{-3}$ is formed. The p-type impurities may reach the active layer 3 and lower cladding layer 2. Impurities are not implanted into a region 10B shaded by the eaves portion 20A of the mask pattern 20 and into the ridge portion 10A. After ion implantation, the mask pattern 20 is removed. Thermal diffusion method may be used instead of ion implantation.

If proton is implanted instead of p-type impurities, a capacitance reducing region 10C of high resistance can be formed. If a dose is $1\times10^{13}$ cm$^2$, a resistivity of the capacitance reducing region 10C is $1\times10^7$ Ωm.

Figure 2D:
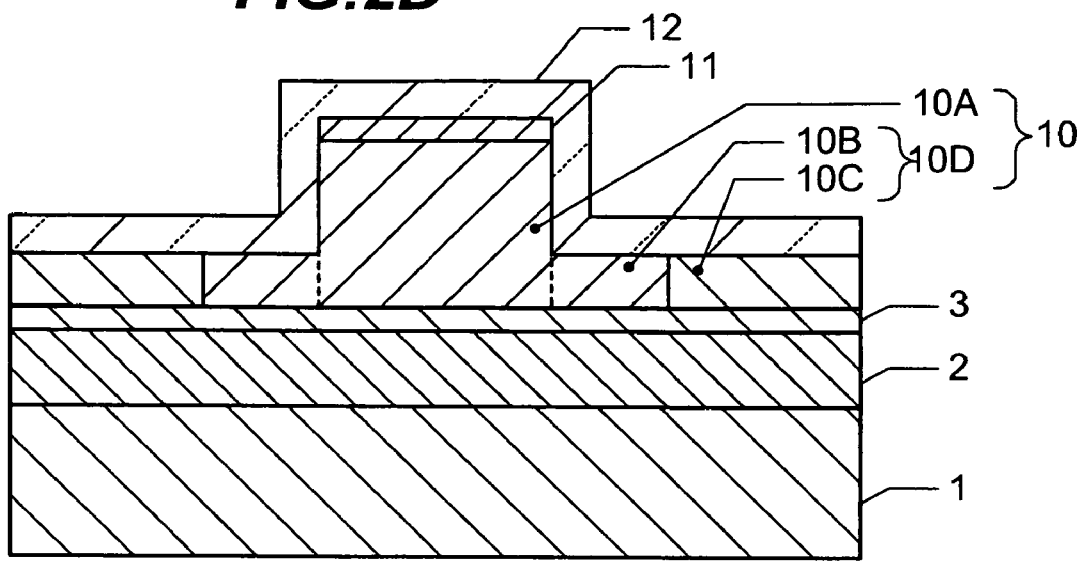

As shown in FIG. 2D, a protective film 12 is formed covering the surfaces of the upper cladding layer 10 and contact layer 11, for example, by chemical vapor deposition (CVD).

Figure 2E:
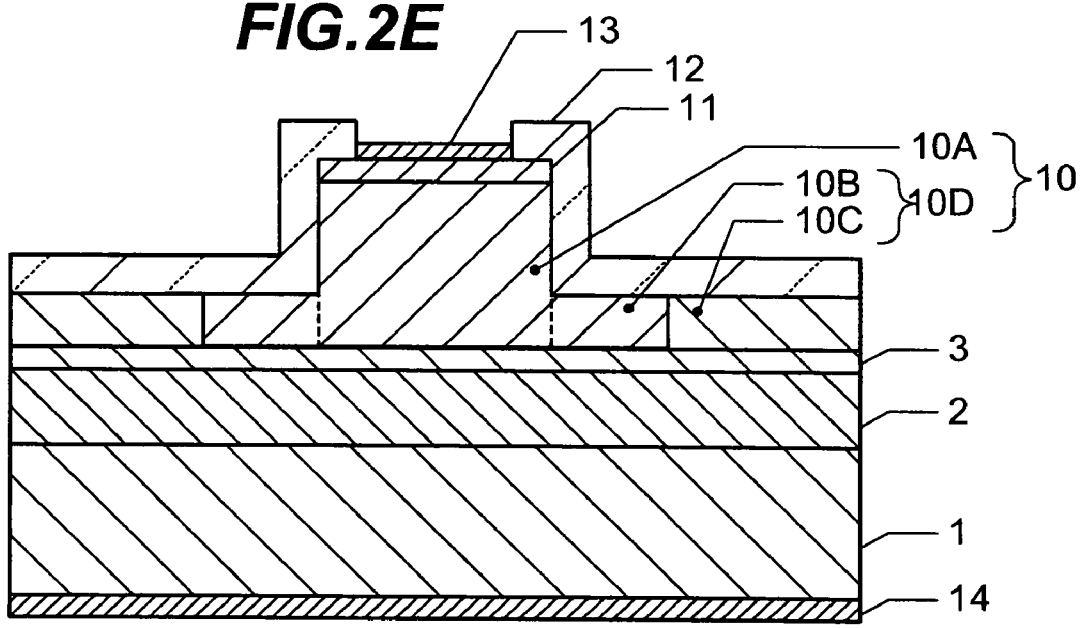

As shown in FIG. 2E, an opening is formed through the protective film 12 to expose a partial upper surface of the contact layer 11. An upper electrode 13 is formed on the contact layer 11 exposed in the opening, the upper electrode having a two-layer structure of an AuGe layer and an Au layer. The upper electrode 13 may be formed by a lift-off method using a resist pattern used as an etching mask when the opening is formed through the protective film 12. A lower electrode 14 is formed on the bottom of the semiconductor substrate 1, the lower electrode having a two-layer structure of an AuZn layer and an Au layer. Thereafter, the semiconductor substrate is cleaved and the facets are coated.

In the manufacture method described above, the eaves portion 20A shown in FIG. 2C serves as a mask during ion implantation so that p-type impurities are prevented from being implanted into the ridge contiguous region 10B.

In the embodiment, lateral etching of the upper cladding layer 10 is utilized in the process shown in FIG. 2B. Therefore, a connection line between the side edge of the ridge portion 10A and the upper surface of the cover portion 10D is not represented in an actual case by a clear line of intersection between the side edge and the upper surface intersecting with each other at a right angle as shown in FIG. 2B.

Figure 3:
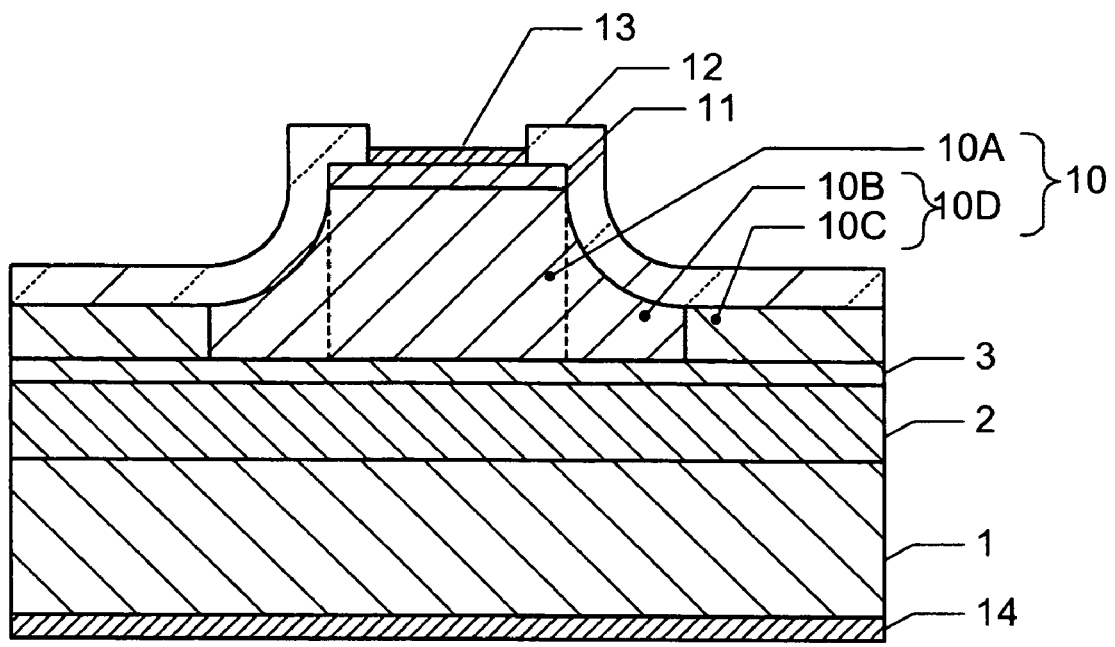
FIG. 3 is a cross sectional view of the p-type quantum dot laser device of the first embodiment.

As shown in FIG. 3, the upper surface of the cover region 10D slopes gradually in an area adjacent to the side edge of the ridge portion 10A, so that it becomes lower with distance from the ridge portion 10A. In this case, the ridge portion 10A can be defined to be a region which has generally a flat upper surface. The upper surface of the ridge contiguous region 10B is constituted of a slope surface. It is obvious that the advantages described in the first embodiment can be obtained even if the upper surface of the ridge contiguous region 10B is inclined.

Next, with reference to FIGS. 4A to 4E, description will be made on another manufacture method for the p-type quantum dot laser device of the first embodiment.

Figure 4A:
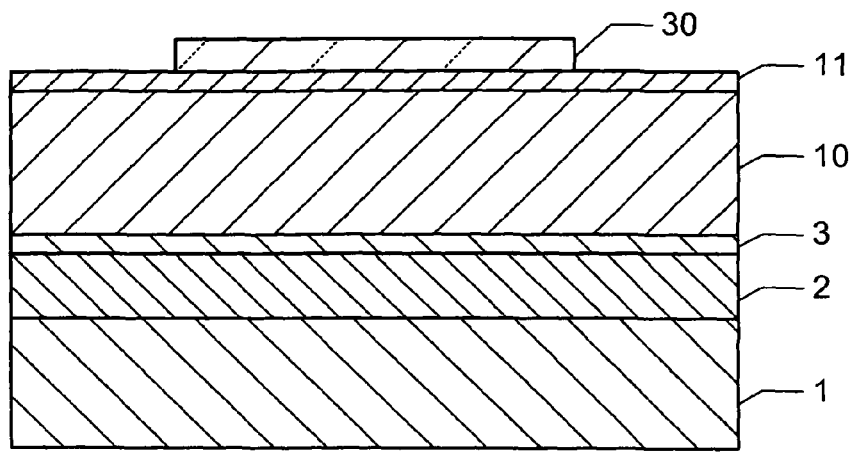
FIGS. 4A to 4E are cross sectional views of the p-type quantum dot laser device of the first embodiment during manufacture by another manufacture method.

A lamination structure between a semiconductor substrate 1 and a contact layer 11 shown in FIG. 4A is the same as that shown in FIG. 2A. A $SiO_2$ film is formed on the contact layer 11 to a thickness of 300 nm, and patterned to form a first mask pattern 30. The first mask pattern 30 covers an area slightly wider than the region corresponding to the ridge portion 10A shown in FIG. 1A.

Figure 4B:
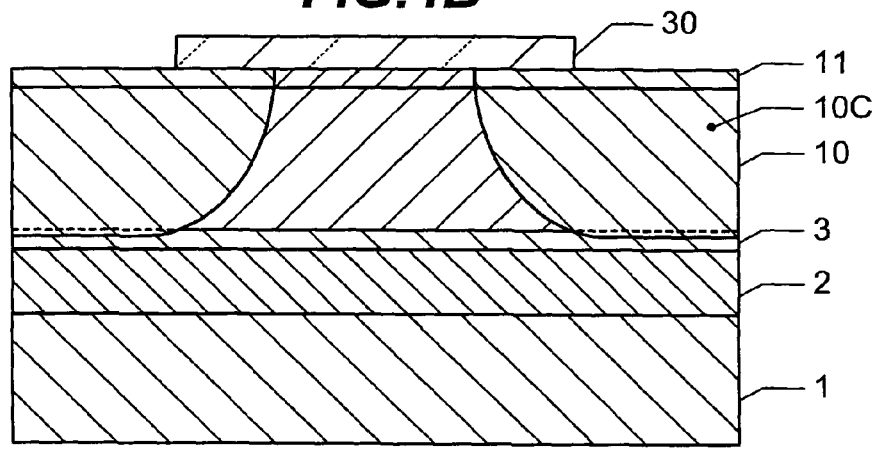

As shown in FIG. 4B, by using the first mask pattern 30 as a mask, p-type impurities, e.g., Zn is thermally diffused into the contact layer 11 and upper cladding layer 10 from the surface of the contact layer 11. A p-type capacitance reducing region 10C is therefore formed in the upper cladding layer 10. A p-type impurity concentration of the capacitance reducing region 10C is, for example, $1 \times 10^{18}$ $cm^{-3}$. The capacitance reducing region 10C has a thickness allowing to reach at least the upper surface of the active region 3. A capacitance reducing region 10C of high resistance may be formed by diffusing hydrogen.

Since p-type impurities diffuse also in a lateral direction, the side edge of the capacitance reducing region 10C gets into under the mask pattern 30. After p-type impurity is diffused, the first mask pattern 30 is removed.

Figure 4C:
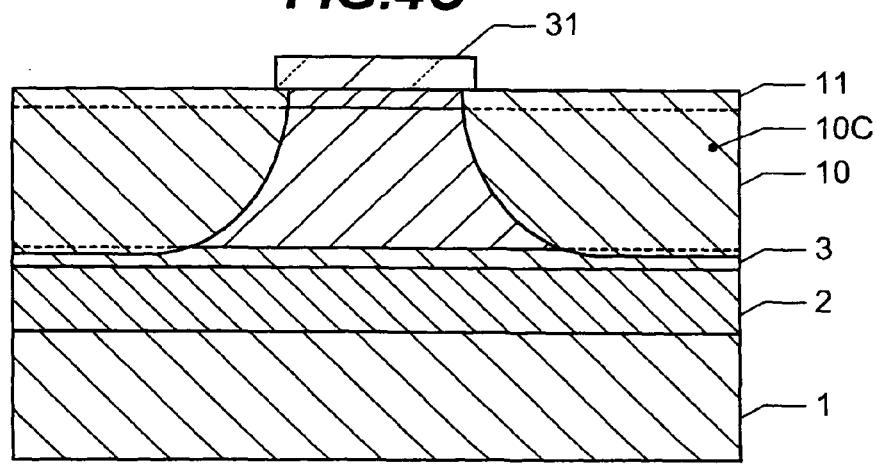

As shown in FIG. 4C, a second mask pattern 31 of $SiO_2$ is formed on the contact layer 11. A plan shape of the second mask pattern 31 matches the plan shape of the ridge portion 10A shown in FIG. 1A.

Figure 4D:
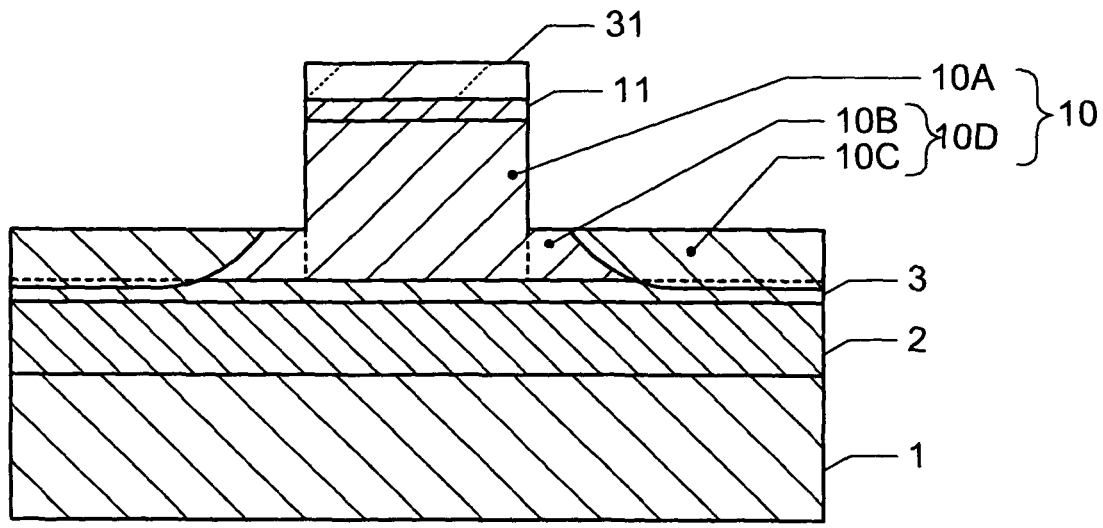

As shown in FIG. 4D, by using the second mask pattern 31 as an etching mask, the contact layer 11 and upper cladding layer 10 are etched until the upper cladding layer 10 is thinned to a thickness of 0.1 µm. In etching the contact layer 11 and upper cladding layer 10, for example, reactive ion etching (RIE) may be adopted using chlorine as etching gas.

A ridge portion 10A therefore remains in a region covered with the second mask pattern 31, and a cover portion 10D having a thickness of about 0.1 µm remains on both sides of the ridge portion 10A. The plan shape of the second mask pattern 31 is set in such a manner that the capacitance reducing region 10C in the cover portion 10D is spaced apart from the second mask pattern 31 by some distance in an in-plane direction. An n-type ridge contiguous region 10B is therefore formed between the ridge portion 10A and the capacitance reducing region 10C.

Figure 4E:
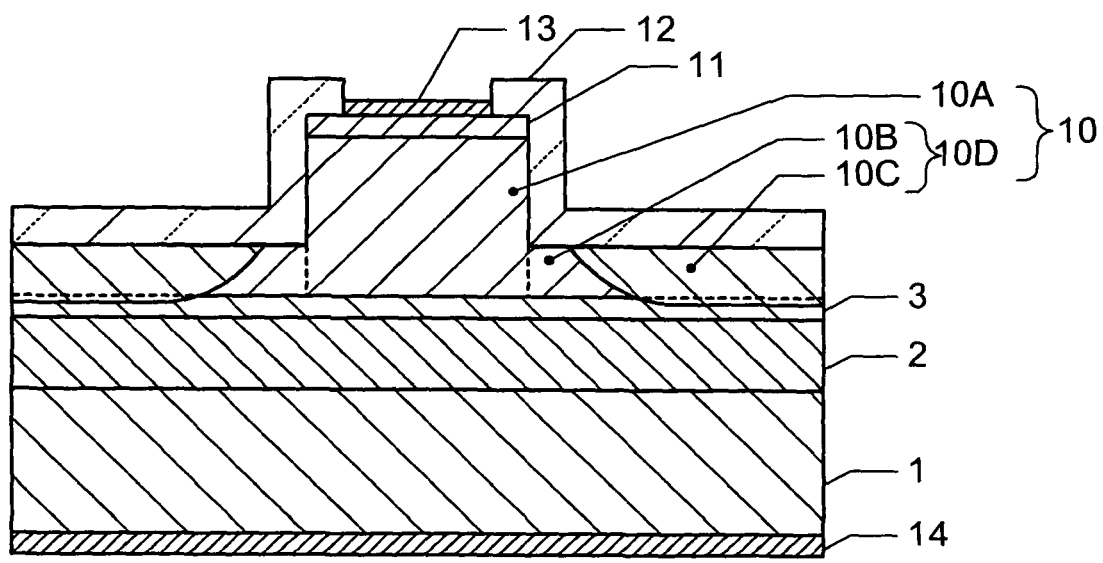

As shown in FIG. 4E, a protective film 12, an upper electrode 13 and a lower electrode 14 are formed. These are formed by the same method as the method described with reference to FIGS. 2D and 2E.

The method shown in FIGS. 4A to 4E adopts RIE having high anisotropy to etch the upper cladding layer 10. It is therefore possible to make the sidewall of the ridge portion 10A generally vertical to the substrate surface. Since this method forms the capacitance reducing region 10C by thermal diffusion, a portion of the capacitance reducing region 10C on the ridge portion 10A side has a cross section which becomes shallower toward to the ridge portion 10A. Also in this case, an electrostatic capacitance of the device can be reduced because a pn junction is not formed in the region where the capacitance reducing region 10C reaches the upper surface of the active region 3.

In the process shown in FIG. 4B, doping the p-type impurities may be performed by ion implantation instead of thermal diffusion to form the capacitance reducing region 10C.

In the first embodiment described above, the p-type ridge contiguous region 10B is disposed between the ridge portion 10A and capacitance reducing region 10C. Instead, the ridge contiguous region 10B may be omitted and the ridge portion 10A may be in directly contact with the capacitance reducing region 10C. In this case, carriers are not injected into the active layer 3 just under the capacitance reducing region 10C. Of the light propagating in the waveguide, light components penetrated to the outside from the side edge of the ridge portion 10A are absorbed by the active region 3 into which carriers are not injected. However, as the width of the ridge portion 10A is broadened to about 3 µm, a light penetration distance becomes short and light absorption by the active layer 3 is small. Therefore, no severe problem of device operation occurs.

As the width of the ridge portion 10A is widened, there is a fear of generation of a higher harmonic transverse mode. As the cover portion 10C disposed on both sides of the ridge portion 10A is made thick, a higher harmonic transverse mode is hard to be generated. For example, if the width of the ridge portion 10A is set to 3 µm and the thickness of the cover portion 10D is set to 0.2 µm, it is possible to prevent a higher harmonic transverse mode from being generated.

In the process shown in FIG. 2B, if the width of the mask pattern 20 is set to be equal to the width of the ridge portion 10A and the contact layer 11 and upper cladding layer 10 are etched by RIE or the like having high anisotropy, it is possible to obtain a structure that the ridge portion 10A is in directly contact with the capacitance reducing region 10C.

Figure 5:
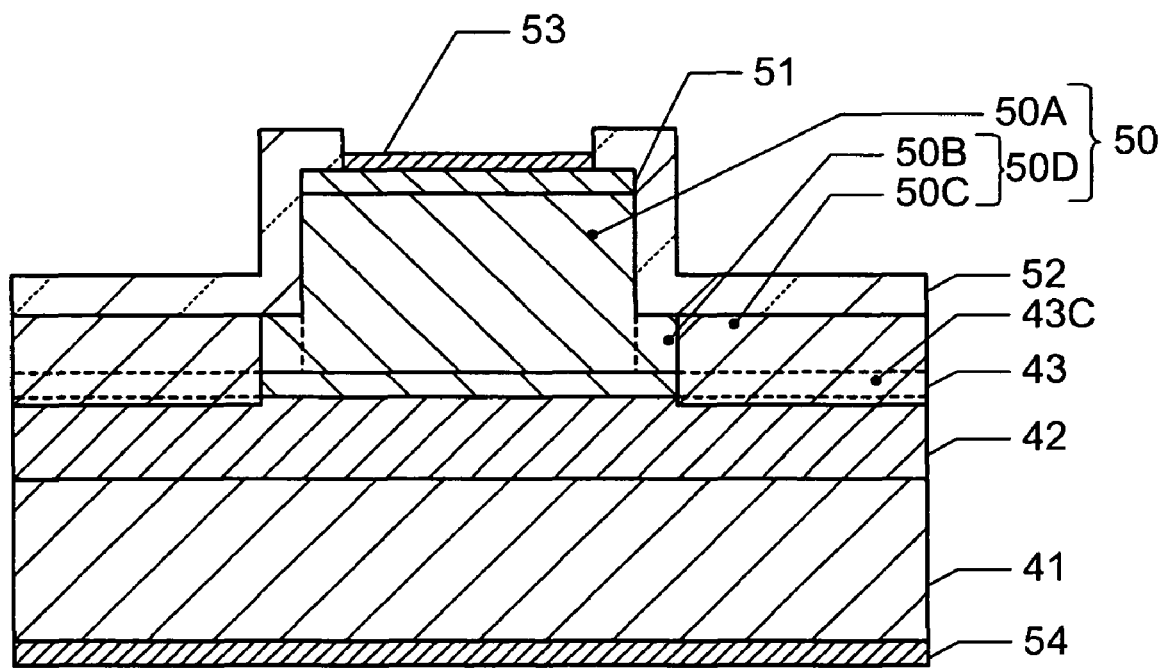
FIG. 5 is a cross sectional view of a p-type quantum dot laser device according to a second embodiment.

FIG. 5 is a cross sectional view of a p-type quantum dot laser device according to the second embodiment. The first embodiment shown in FIG. 1A uses the p-type semiconductor substrate 1, whereas the second embodiment uses an n-type semiconductor substrate 41. Description will be made on the p-type quantum dot laser device of the second embodiment in comparison with the first embodiment.

In the second embodiment, the semiconductor substrate 41 of n-type GaAs is used in place of the semiconductor substrate 1 of p-type GaAs of the first embodiment. In place of the lower cladding layer 2 of p-type $Al_{0.4}Ga_{0.6}As$, a lower cladding layer 42 of n-type $Al_{0.4}Ga_{0.6}As$ is used. An active layer 43 disposed on the lower cladding layer 42 has the same structure as that of the active layer 3 of the first embodiment.

In place of the ridge portion 10A and ridge contiguous region 10B of n-type $Al_{0.4}Ga_{0.6}As$, a ridge portion 50A and a ridge contiguous region 50B of p-type $Al_{0.4}Ga_{0.6}As$ are disposed. In place of the capacitance reducing region 10C of a p-type or high resistance of the first embodiment, a capacitance reducing region 50C of an n-type or high resistance is disposed. In the first embodiment, it is sufficient if the capacitance reducing region 10C reaches at least the upper surface of the active layer 3, whereas in the second embodiment, the capacitance reducing region reaches at least the upper surface of the lower cladding layer 42 to form also in the active layer 43 the capacitance reducing region 43C of an n-type or high resistance.

In place of the contact layer 13 of n-type GaAs of the first embodiment, a contact layer 51 of p-type GaAs is disposed. A protective film 52 having the same structure as that of the protective film 12 of the first embodiment is disposed. In the second embodiment, an upper electrode 53 has a two-layer structure of an AuZn layer and an Au layer, and a lower electrode 54 has a two-layer structure of an AuGe layer and an Au layer.

The second embodiment is different from the first embodiment in that a conductivity type of each layer made of semiconductor material excepting the active layer is opposite to that of a corresponding layer of the first embodiment and that a depth of the capacitance reducing region is different. The size of each portion of the semiconductor laser device of the second embodiment is the same as that of a corresponding portion of the semiconductor laser device of the first embodiment.

In the second embodiment, the capacitance reducing regions 50C and 43C reach the upper surface of the lower cladding layer 42. Therefore, the pn junction interface between the active layer 43 and lower cladding layer 42 is restricted to the region under the ridge portion 50A and ridge contiguous region 50B. It is therefore possible to reduce an electrostatic capacitance of the device. As in the case of the first embodiment, it is possible to suppress light absorption in the region of the active layer 43 where carriers are not injected and an increase in a device resistance.

Next, with reference to FIGS. 6A to 6C, description will be made on a manufacture method for the p-type quantum dot laser device of the second embodiment.

Figure 6A:
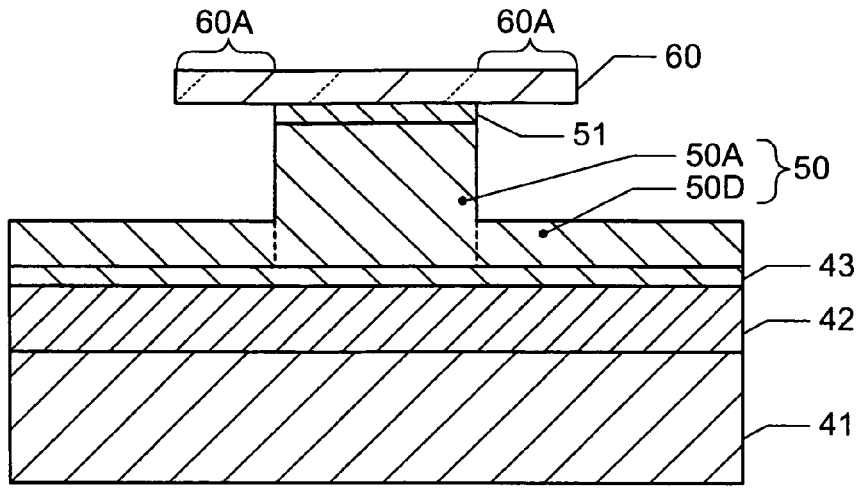
FIGS. 6A to 6C are cross sectional views of the p-type quantum dot laser device of the second embodiment during manufacture.

The structure during manufacture shown in FIG. 6A corresponds to the structure during manufacture of the semiconductor laser device of the first embodiment shown in FIG. 2B. A different point of these structures is only a conductivity type of each semiconductor layer. In the second embodiment, formed on a semiconductor substrate 41 of n-type GaAs are a lower cladding layer 42 of n-type $Al_{0.4}Ga_{0.6}As$ and a p-type quantum dot active layer 43. An upper cladding layer 50 of p-type $Al_{0.4}Ga_{0.6}As$ is formed on the active-layer 43. The upper cladding layer 50 is constituted of a ridge portion 50A and a cover portion 50D. A contact layer 51 of p-type GaAs is formed on the ridge portion 50A. A mask pattern 60 is formed on the contact layer 51. The mask pattern 60 includes eaves portions 60A extending to the outside of the side edges of the ridge portion 50A.

Figure 6B:
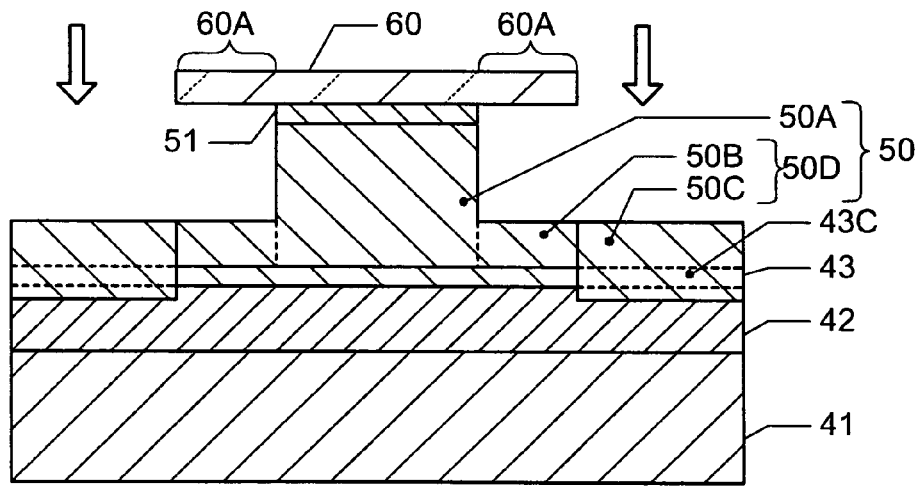

As shown in FIG. 6B, by using the mask pattern 60 as a mask, n-type impurity, e.g., Si ions are implanted under the condition of a dose of $1.5 \times 10^{13}$ cm$^{-2}$. An acceleration energy is set in such a manner that at least the region reaching the bottom of the active layer 3 has an n-type. Under these conditions, a capacitance reducing regions 50C and 43C having an n-type impurity concentration of $1 \times 10^{18}$ cm$^{-3}$ are formed in the upper cladding layer 50 and active layer 43, respectively. A region between the capacitance reducing region 50C and ridge portion 50A is shaded by the eaves portions 60A. The shaded ridge contiguous region 50B maintains the p-type. The active region 43 under the ridge contiguous region 50B maintains the p-type. After ion implantation, the mask pattern 60 is removed. Instead of Si ions, proton may be doped to make the capacitance reducing region 50C have high resistance.

Figure 6C:
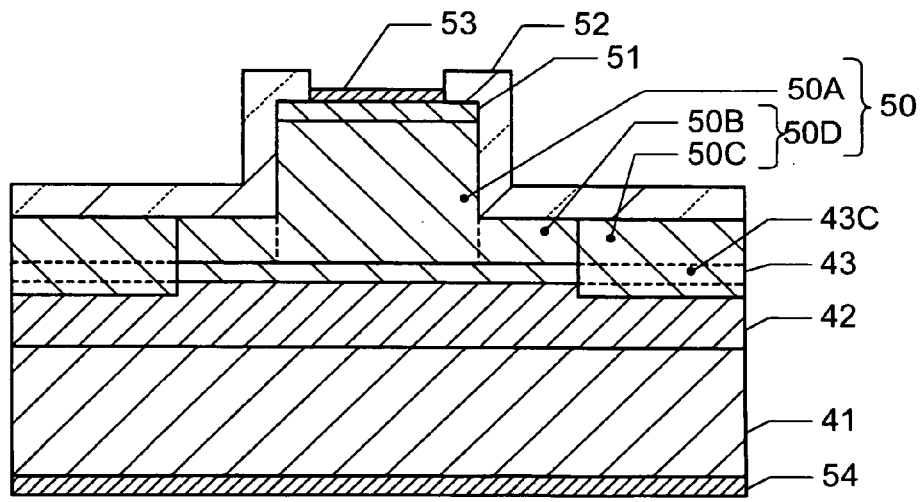
Figure 8A:
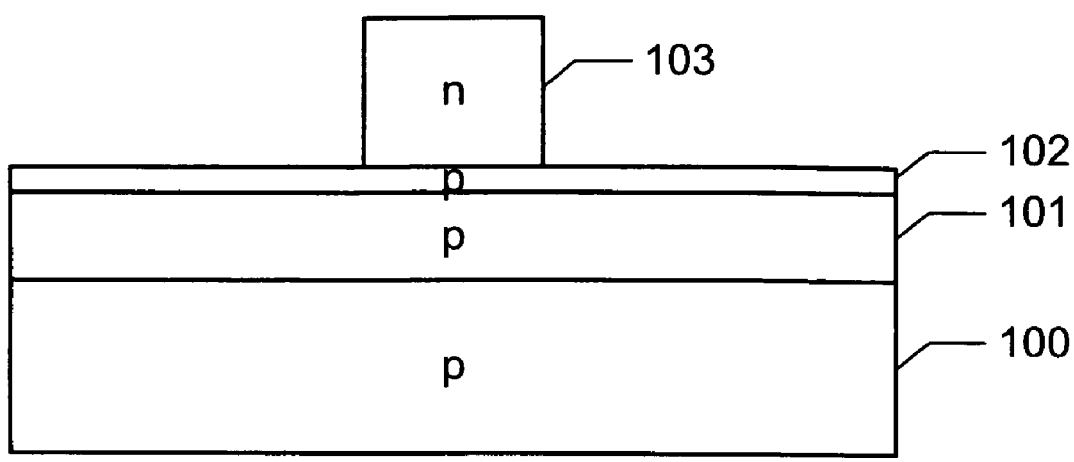
FIGS. 8A and 8B are schematic cross sectional views of conventional p-type quantum dot laser devices.
Figure 8B:
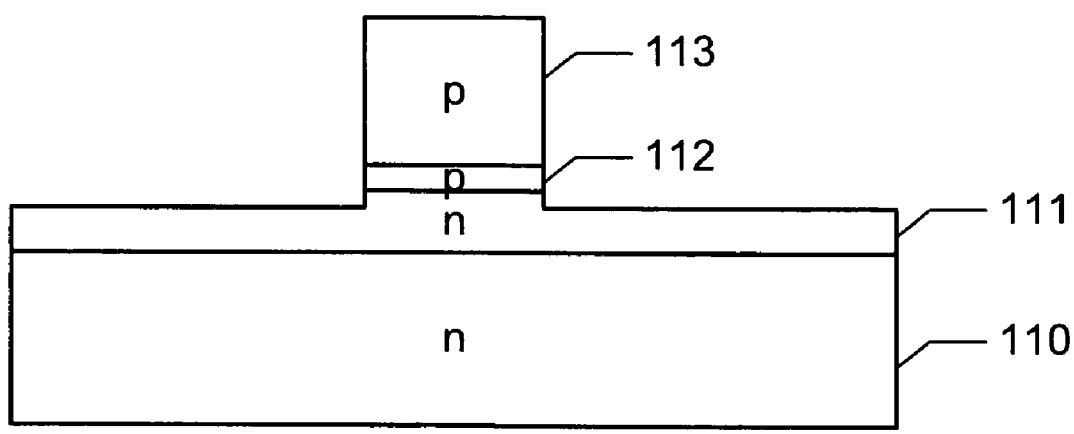

As shown in FIG. 6C, a protective film 52, an upper electrode 53 and a lower electrode 54 are formed. These are formed by the same method as that of the first embodiment shown in FIG. 2E. Thereafter, the semiconductor substrate is cleaved and the facets are coated to complete the semiconductor laser device of the second embodiment.

With reference to FIGS. 7A to 7C, description will be made on another manufacture method for the p-type quantum dot laser device of the second embodiment.

The structure during manufacture shown in FIG. 7A corresponds to the structure during manufacture of the semiconductor laser device of the first embodiment shown in FIG. 4A. A different point of these structures is only a conductivity type of each semiconductor layer. In the second embodiment, formed on a semiconductor substrate 41 of n-type GaAs are a lower cladding layer 42 of n-type $Al_{0.4}Ga_{0.6}As$, a p-type quantum dot active layer 43, an upper cladding layer 50 of p-type $Al_{0.4}Ga_{0.6}As$ and a contact layer 51 of p-type GaAs. A first mask pattern 70 is formed on the contact layer 51.

As shown in FIG. 7B, by using the first mask pattern 70 as a mask, Si is thermally diffused into the contact layer 51, upper cladding layer 50 and active layer 43. Capacitance reducing regions 50C and 43C of an n-type are formed in the upper cladding layer 50 and active layer 43, respectively. Si diffusion is performed under the condition that the n-type region reaches at least the bottom of the active layer 43 (upper surface of the lower cladding layer 42). After Si diffusion, the first mask pattern 70 is removed. Instead of Si, hydrogen may be diffused to make the capacitance reducing regions 50C and 43C have high resistance.

As shown in FIG. 7C, the upper cladding layer 50 is partially etched to form a ridge portion 50A, and thereafter a protective film 52, an upper electrode 53 and a lower electrode 54 are formed. These are formed by the same method as that of the first embodiment shown in FIGS. 4C to 4E. As in the case of the first embodiment, the semiconductor substrate is cleaved and the facets are coated to complete the semiconductor laser device of the second embodiment.

Also in the second embodiment, as in the case of the first embodiment, the ridge contiguous region 50B shown in FIG. 5 may be omitted and the ridge portion 50A is in direct contact with the capacitance reducing region 50C.

In the first and second embodiments described above, a semiconductor laser device made of InAs/AlGaAs based compound semiconductor material and formed on a GaAs substrate has been described illustratively. Other semiconductor materials may also be adopted. For example, it is possible to manufacture a semiconductor laser device made of GaInAsP based or AlGaInAs based semiconductor material and formed on an InP substrate. A high resistance substrate may be used instead of an n-type substrate and a p-type substrate. In this case, since an electrode cannot be formed on the bottom of the substrate, a partial upper surface of the lower cladding layer is exposed and the lower electrode is formed on the exposed surface.

Further, in the first and second embodiments, although a Fabry-Perot type semiconductor laser device is used by way of example, the characteristic structures of the embodiments are applicable to a semiconductor laser device of other structures such as a distributed feedback (DFB) laser device. The embodiment structures are also applicable to a buried type semiconductor laser device to be manufactured by performing a plurality of crystal growth processes including a buried growth process.

The present invention has been described in connection with the preferred embodiments. The invention is not limited only to the above embodiments. It will be apparent to those skilled in the art that other various modifications, improvements, combinations, and the like can be made.

What are claimed are:

1. A method for manufacturing an optical semiconductor device comprising steps of:
   (a) forming an active layer having a p-type quantum dot structure over a lower cladding layer made of semiconductor material of a first conductivity type;
   (b) forming an upper cladding layer made of semiconductor material of a second conductivity type opposite to the first conductivity type over the active layer;
   (c) covering an upper surface of the upper cladding layer in an area extending in one direction, with a mask pattern;
   (d) by using the mask pattern as an etching mask, etching the upper cladding layer partway in a thickness direction thereof;
   (e) by using the mask pattern as a mask, implanting or diffusing impurities into the upper cladding layer to make the upper cladding layer have the first conductivity type or high resistance to form a capacitance reducing region; and
   (f) removing the mask pattern,
   wherein the capacitance reducing region formed in the step (e) reaches at least an upper surface of the active layer if the lower cladding layer is a p-type, and reaches at least an upper surface of the lower cladding layer if the lower cladding layer is an n-type.

2. The method for manufacturing the optical semiconductor device according to claim 1, wherein in the step (d), the upper cladding layer is etched also in a lateral direction from a side edge of the mask pattern to leave an eaves portion of the mask pattern protruding in an eaves shape, and in the step (e) the impurities are not implanted nor diffused into regions shaded by the eaves portion.

3. The method for manufacturing the optical semiconductor device according to claim 2, wherein in the step (d) a depth of each region laterally etched from the side edge of the mask pattern is equal to or longer than a wavelength in waveguide of the active layer.

4. The method for manufacturing the optical semiconductor device according to claim 2, wherein in the step (d) the depth of each region laterally etched from the side edge of the mask pattern is 5 µm or shorter.

5. A method for manufacturing an optical semiconductor device comprising steps of:
   (a) forming an active layer having a p-type quantum dot structure over a lower cladding layer made of semiconductor material of a first conductivity type;
   (b) forming an upper cladding layer made of semiconductor material of a second conductivity type opposite to the first conductivity type over the active layer;
   (c) covering an upper surface of the upper cladding layer in an area extending in one direction, with a first mask pattern;
   (d) by using the first mask pattern as a mask, implanting or diffusing impurities into the upper cladding layer to make the upper cladding layer have the first conductivity type or high resistance to form a capacitance reducing region;
   (e) removing the first mask pattern;
   (f) covering an inner area spaced by a distance from each of both side edges of the area covered with the first mask pattern, with a second mask pattern; and
   (g) by using the second mask pattern as an etching mask, etching the upper cladding layer partway in a thickness direction thereof,
   wherein:
   the capacitance reducing region formed in the step (d) reaches at least an upper surface of the active layer if the lower cladding layer is a p-type, and reaches at least an upper surface of the lower cladding layer if the lower cladding layer is an n-type; and
   a plan shape of the second mask pattern is set in such a manner that after etching in the step (g), the capacitance reducing region is spaced apart in an in-plane direction by a distance from the second mask pattern.

6. The method for manufacturing the optical semiconductor device according to claim 5, wherein a distance in the in-plane direction between the capacitance reducing region after etched in the step (g) and the second mask pattern is equal to or longer than a wavelength in waveguide of the active layer.

7. The method for manufacturing the optical semiconductor device according to claim 5, wherein the distance in the in-plane direction between the capacitance reducing region after etched in the step (g) and the second mask pattern is 5 µm or shorter.

* * * * *